United States Patent
Chen et al.

(10) Patent No.: US 11,882,748 B2
(45) Date of Patent: Jan. 23, 2024

(54) PIXEL STRUCTURE AND DISPLAY PANEL

(71) Applicant: GUANGDONG JUHUA PRINTED DISPLAY TECHNOLOGY CO., LTD., Guangzhou (CN)

(72) Inventors: Yawen Chen, Guangzhou (CN); Wen Shi, Guangzhou (CN)

(73) Assignee: GUANGDONG JUHUA PRINTED DISPLAY TECHNOLOGY CO., LTD., Guangzhou (CN)

( * ) Notice: Subject to any disclaimer, the term of this patent is extended or adjusted under 35 U.S.C. 154(b) by 249 days.

(21) Appl. No.: 17/339,081

(22) Filed: Jun. 4, 2021

(65) Prior Publication Data

US 2021/0305332 A1   Sep. 30, 2021

Related U.S. Application Data

(63) Continuation of application No. PCT/CN2019/120743, filed on Nov. 25, 2019.

(30) Foreign Application Priority Data

Dec. 29, 2018   (CN) .......................... 201811647942.3

(51) Int. Cl.
H10K 59/35   (2023.01)

(52) U.S. Cl.
CPC ......... H10K 59/353 (2023.02); H10K 59/352 (2023.02)

(58) Field of Classification Search
CPC .. H10K 59/351–353; G09G 2300/0452; G09F 9/302
See application file for complete search history.

(56) References Cited

U.S. PATENT DOCUMENTS

| | | | |
|---|---|---|---|
| 9,640,589 B2 | 5/2017 | Wang | |
| 10,013,913 B2 | 7/2018 | Guo et al. | |
| 10,319,277 B2 | 6/2019 | Wang et al. | |
| 2015/0009104 A1 | 1/2015 | Kim et al. | |
| 2016/0284766 A1* | 9/2016 | Wang | ............. H10K 59/353 |
| 2016/0293678 A1* | 10/2016 | Wang | ............. H01L 27/12 |

(Continued)

FOREIGN PATENT DOCUMENTS

| | | |
|---|---|---|
| CA | 111384096 A | 7/2020 |
| CN | 202887618 U | 4/2013 |

(Continued)

OTHER PUBLICATIONS

International Search Report and Written Opinion issued in International Application No. PCT/CN2019/120743, dated Feb. 19, 2020, 5 pages.

*Primary Examiner* — Eric K Ashbahian
(74) *Attorney, Agent, or Firm* — Dorsey & Whitney LLP

(57) ABSTRACT

Provided in the present application is a pixel structure. The pixel structure includes a plurality of pixel units. Each of the pixel units includes four sub-pixels, and the four sub-pixels are one first sub-pixel, two second sub-pixels, and one third sub-pixel, respectively. The two second sub-pixels share a common side to form a second sub-pixel unit. The first sub-pixel and the third sub-pixel are disposed at two opposite sides of the second sub-pixel unit, respectively. And each of the pixel units has a shape of a triangle. Also provided in the present application is a display panel.

18 Claims, 6 Drawing Sheets

(56) References Cited

U.S. PATENT DOCUMENTS

| 2016/0300520 | A1* | 10/2016 | Wang | ............... | G09F 9/30 |
| 2017/0132969 | A1* | 5/2017 | Guo | ............... | H10K 59/353 |
| 2018/0197442 | A1* | 7/2018 | Song | ............... | H10K 59/353 |
| 2020/0168674 | A1* | 5/2020 | Tan | ............... | G02F 1/1333 |

FOREIGN PATENT DOCUMENTS

| CN | 103811533 A | 5/2014 |
| CN | 104795427 A | 7/2015 |
| CN | 106653804 A | 5/2017 |
| WO | 2020134795 A1 | 7/2020 |

* cited by examiner

PIXEL STRUCTURE AND DISPLAY PANEL

CROSS-REFERENCE TO RELATED APPLICATION

This application is a continuation application of PCT International Application No. PCT/CN2019/120743, filed on Nov. 25, 2019 and entitled "PIXEL STRUCTURE AND DISPLAY PANEL," which claims priority to Chinese Patent Application No. 201811647942.3, entitled "PIXEL STRUCTURE AND DISPLAY PANEL," filed on Dec. 29, 2018, the disclosure of both applications are hereby incorporated by reference in their entirety.

TECHNICAL FIELD

The present disclosure relates to the field of display technologies, and more particularly, to a pixel structure and a display panel.

BACKGROUND

Organic light emitting diodes (OLEDs) have become the mainstream of future displays due to their advantages such as self-luminescence, fast response, wide viewing angle, high brightness, and thinness. Currently, a means of evaporating organic light-emitting materials for emitting light independently is usually used to achieve full-color display of OLED, and it mainly uses sophisticated metal shadow mask and pixel alignment technologies to manufacture red, green, and blue light-emitting layers by evaporation. However, the conventional method is limited by the precision of the pattern dimensions of the metal shadow mask, so that the resolution of the OLED display prepared by the means of evaporating organic light-emitting materials is limited.

SUMMARY

Based on this, the present disclosure provides a pixel structure and a display panel that can improve resolution to address the above technical problem.

A pixel structure, including a plurality of pixel units. Each of the pixel units comprises four sub-pixels, and the four sub-pixels are one first sub-pixel, two second sub-pixels, and one third sub-pixel, respectively. The two second sub-pixels share a common side to form a second sub-pixel unit. The first sub-pixel and the third sub-pixel are disposed at two opposite sides of the second sub-pixel unit, respectively, and each of the pixel units has a shape of a triangle.

In one of the embodiments, each two of the second sub-pixel units of the plurality of pixel units share a common side to form a pixel set comprising the plurality of pixel units. In the pixel set, any two adjacent pixel units are joined by same sub-pixels, and any two adjacent pixel sets are joined by same sub-pixels.

In one of the embodiments, each of the pixel units has a shape of a right triangle, and a right angle of the right triangle is an included angle between two intersecting sides of the second sub-pixel unit.

In one of the embodiments, each two of the second sub-pixel units of four pixel units share a common side to form the pixel group having a quadrilateral shape.

In a horizontal direction, pixel sets are arranged to form a pixel row, and in the pixel row, any two adjacent pixel groups are joined by same sub-pixels.

In a vertical direction, pixel sets are arranged to form a pixel column, and in the pixel column, any two adjacent pixel groups are joined by same sub-pixels.

In one of the embodiments, same sub-pixels are arranged along circles in the plurality of pixel units, and any adjacent two same sub-pixels in a circle shares a common side, forming a plurality of first sub-pixel groups each comprising the first sub-pixels arranged along a circle, a plurality of second sub-pixel groups each comprising the second sub-pixels arranged along a circle, and a plurality of third sub-pixel groups each comprising the third sub-pixels arranged along a circle.

The plurality of first sub-pixel groups, the plurality of second sub-pixel groups, and the plurality of third sub-pixel groups constitute the pixel structure. The first sub-pixel groups and the second sub-pixel groups are arranged alternately in a first direction to form a first pixel group. The second sub-pixel groups and the third sub-pixel groups are arranged alternately in the first direction to form a second pixel group. The first pixel group and the second pixel group are alternately arranged in a second direction. Second sub-pixel groups in any adjacent the first pixel group the second pixel group are arranged in a staggered manner, and the first direction intersects with the second direction.

In one of the embodiments, each of the pixel units has a shape of a right triangle, and a right angle of the right triangle is an included angle between two intersecting sides of the second sub-pixel unit.

In one of the embodiments, each of the first sub-pixel groups is formed by splicing eight first sub-pixels. Each of the second sub-pixel groups is formed by splicing eight second sub-pixels, and each of the third sub-pixel groups is formed by splicing eight third sub-pixels.

In one of the embodiments, each of the pixel units has a shape of an isosceles right triangle.

In one of the embodiments, the first sub-pixel is a red sub-pixel, the second sub-pixel is a green sub-pixel, and the third sub-pixel is a blue sub-pixel.

In one of the embodiments, the two second sub-pixels in each of the pixel units are symmetrically distributed.

In one of the embodiments, the first sub-pixel and the third sub-pixel in each of the pixel units are symmetrically distributed with respect to the second sub-pixel unit.

In one of the embodiments, the first sub-pixel has a shape of a triangle, the second sub-pixel unit has a shape of a quadrilateral, and the third sub-pixel has a shape of a triangle.

Or the first sub-pixel has a shape of a triangle, the second sub-pixel unit has a shape of a pentagon, and the third sub-pixel has a shape of a triangle.

Or the first sub-pixel, the second sub-pixel unit, and the third sub-pixel each have a shape of a quadrilateral.

In one of the embodiments, in each of the pixel units, one second sub-pixel is disposed between the first sub-pixel and the third sub-pixel to form an integral structure, and another second sub-pixel is disposed on one side of the integral structure.

Or the two second sub-pixels are both disposed between the first sub-pixel and the third sub-pixel, and one second sub-pixel and the first sub-pixel are arranged to share a common side, another second sub-pixel and the third sub-pixel are arranged to share a common side.

Or a fixed point is set in each of the pixel units, and straight lines each connecting the fixed point and a point on each of three sides of the triangle divide each of the pixel units into the first sub-pixel, the second sub-pixel unit, and the third sub-pixel, and a straight line connecting the fixed point and a vertex of the second sub-pixel unit divides the second sub-pixel unit into the two second sub-pixels.

In one of the embodiments, the first sub-pixel, the second sub-pixel, and the third sub-pixel have shapes of isosceles right triangles with a same shape and a same area.

Or the first sub-pixel and the third sub-pixel have shapes of isosceles right triangles with a same area, and the two second sub-pixels have quadrilateral shapes with a same shape and a same area.

Or the first sub-pixel and the third sub-pixel have quadrilateral shapes with a same shape and a same area, and the two second sub-pixels have triangular shapes with a same shape and a same area.

In one of the embodiments, the point on each of the three sides of the triangle is a midpoint of each of the three sides of the triangle.

In one of the embodiments, the first direction is perpendicular to the second direction.

In one of the embodiments, in each of the pixel units, the first sub-pixel is disposed on a side of one second sub-pixel, and the third sub-pixel is disposed on a side of another second sub-pixel.

In one of the embodiments, in each of the pixel units, the two second sub-pixels are both disposed between the first sub-pixel and the third sub-pixel.

In one of the embodiments, each of the first sub-pixel groups and each of the third sub-pixel groups have quadrilateral shapes with a same shape and a same area. Each of the first sub-pixel groups is formed by joining eight red sub-pixels arranged radially. Each of the third sub-pixel groups is formed by joining eight blue sub-pixels arranged radially, and each of the second sub-pixel groups has a shape of an octagon and is formed by joining eight green sub-pixels arranged radially A display panel includes any one of the pixel structures mentioned above.

In the above pixel structure and the display panel, since the plurality of pixel units in the pixel structure each include four sub-pixels, which are respectively one first sub-pixel, two second sub-pixels, and one third sub-pixel. The two second sub-pixels share a common side to form a second sub-pixel unit. The first sub-pixel and the third sub-pixel are respectively disposed on opposite sides of the second sub-pixel unit, and the pixel unit has a shape of a triangle. That is, the ratio of the number of the first sub-pixels to the number of the second sub-pixels to the number of the third sub-pixels is 1:2:1, thereby ensuring that the first sub-pixel and the third sub-pixel are configures to be shared sub-pixels, so that the smallest pixel unit can form two display pixel units, thereby improving the resolution.

DETAILED DESCRIPTION

Figure 1:
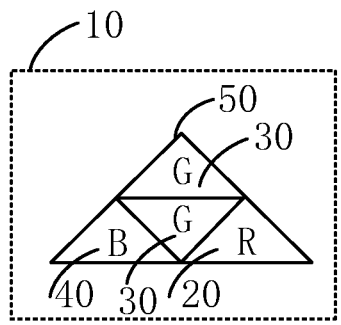
FIG. 1 is a schematic structural diagram illustrating a pixel unit in which a shape of each sub-pixel is an equilateral triangle in an embodiment.

To make the purposes, technical solutions and advantages of the present disclosure to be clearer and better understood, the present disclosure will be further described in detail with reference to the accompanying drawings and embodiments below. It should be understood that the specific embodiments described herein are only used to explain the present disclosure, but not intended to limit the present disclosure.

In an embodiment, a pixel structure 100 is provided. A sub-pixel is a most basic unit that constitutes an image. The pixel structure 100 is a structure configured to determine the appearance of the image and includes a plurality of colored-light sub-pixels arranged according to designated positions. Colored-light sub-pixels generally include three primary colors, namely red, green and blue, which are represented by R (red sub-pixel), G (green sub-pixel) and B (blue sub-pixel).

As shown in FIGS. 1-4, in this embodiment, the pixel structure 100 includes a plurality of pixel units 10. Each of the pixel units 10 includes four sub-pixels, which are respectively one first sub-pixel 20, two second sub-pixels 30, and one third sub-pixel 40. Two second sub-pixels 30 are spliced by sharing a common side to form a second sub-pixel unit 50. The first sub-pixel 20 and the third sub-pixel 40 are disposed at two opposite sides of the second sub-pixel unit 50 respectively. The pixel unit 10 has a shape of a triangle. Three included angles formed by three sides of the triangle are an included angle between two intersecting sides of the first sub-pixel 20, an included angle between two intersecting sides of the second sub-pixel unit 50, and an included angle between two intersecting sides of the third sub-pixel 40, respectively. That sub-pixels share a common side means that the two second sub-pixels are joined without being staggered, that is, the identical sides of the two sub-pixels coincide and are joined. If a pixel defining layer is disposed between the sub-pixels, then the two sub-pixels sharing a common side should be joined with the pixel defining layer in a same direction and at a same angle, that is, when the pixel defining layer is removed, the two sub-pixels may still maintain in a state of sharing the common side.

The first sub-pixel 20, the second sub-pixels 30, and the third sub-pixel 40 in the pixel unit 10, and the second sub-pixel unit 50 formed by the second sub-pixels 30 sharing the common side each may have any shape and any area, that is, they may have a same shape and a same area or they may have different shapes and areas. For example, the first sub-pixel 20 and the third pixel unit 40 may be triangular or quadrilateral, or the two second sub-pixels 30 in the second sub-pixel unit 50 may be triangular or quadrilateral, or the like, then the constituted second sub-pixel unit 50 may be quadrilateral or pentagonal, or the like. In addition, the first sub-pixel 20 and the third sub-pixel 40 are respectively disposed on opposite sides of the second sub-pixel unit 50, and they may be disposed on the left-right opposite sides of the second sub-pixel unit 50, or disposed on the up-down opposite sides of the second sub-pixel unit 50. The first sub-pixel 20 and the third sub-pixel 40 may also be symmetrically distributed on two sides of the second sub-pixel unit 50. No matter in which directions the first sub-pixel 20 and the third sub-pixel 40 are disposed on two sides of the second sub-pixel unit 50, the three included angles formed by three sides in the pixel unit 10 having a shape of a triangle are respectively an included angle between two intersecting sides of the first sub-pixel 20, an included angle between two intersecting sides of the second sub-pixel unit 50, and an included angle between two intersecting sides of the third sub-pixel 40.

Further, the first sub-pixel 20, the second sub-pixel 30, and the third sub-pixel 40 are any one of a red sub-pixel R, a green sub-pixel G, and a blue sub-pixel B, respectively. For example, if the first sub-pixel 20 is the red sub-pixel R, then the second sub-pixel 30 and the third sub-pixel 40 are the green sub-pixel G and the blue sub-pixel B respectively, that is, the second sub-pixel 30 may be the green sub-pixel G and the third sub-pixel 40 is the blue sub-pixel B, or, the second sub-pixel 30 is the blue sub-pixel B and the third sub-pixel 40 is the green sub-pixel G.

In this embodiment, since the plurality of pixel units in the pixel structure each include one first sub-pixel, two second sub-pixels, and one third sub-pixel. The two second sub-pixels are spliced to form the second sub-pixel unit, and the first sub-pixel and the third sub-pixel are disposed on the opposite sides of the second sub-pixel unit, respectively. That is, a ratio of the number of the first sub-pixels to the number of the second sub-pixels to the number of the third sub-pixels is 1:2:1, so as to ensure that the first sub-pixel and the third sub-pixel are shared sub-pixels, so that a smallest pixel unit may form two display pixel units, thereby improving the resolution.

In an embodiment, the two second sub-pixels 30 are spliced by symmetrically sharing a common side to form the second sub-pixel unit 50. That is, the two second sub-pixels 30 may be left-right symmetrical and share a common side to constitute the second sub-pixel unit 50, or be up-down symmetrical and share a common side to constitute the second sub-pixel unit 50.

Further, if the two second sub-pixels 30 are up-down symmetrical and share the common side to constitute the second sub-pixel unit 50, then one of the two second sub-pixels 30 is disposed between the first sub-pixel 20 and the third sub-pixel 40, and another of the two second sub-pixels 30 is disposed on a side of the one of the two second sub-pixel located between the first sub-pixel 20 and the third sub-pixel 40, that is, when the one of the two second sub-pixels 30 is disposed between the first sub-pixel 20 and the second sub-pixel, the three sub-pixels form an integral structure, and the other of the two second sub-pixels 30 is then disposed on a side of the integral structure.

If the two second sub-pixels 30 are left-right symmetrical to constitute the second sub-pixel unit 50, then the two second sub-pixels 30 are both disposed between the first sub-pixel 20 and the third sub-pixel 40, and one of the two second sub-pixels 30 is disposed between the other of the two second sub-pixels 30 and the first sub-pixel 20 or is disposed between the other of the two second sub-pixels 30 and the third sub-pixel 40. That is, the first sub-pixel 20, the two second sub-pixels 30, and the third sub-pixel 40 are arranged in a row, and the one of the two second sub-pixels 30 and the first sub-pixel 20 are separated by the other of the two second sub-pixels 30, or the one of the two second sub-pixels 30 and the third sub-pixel 40 are also separated by the other of the two second sub-pixels 30. In other words, if any one of the two second sub-pixels 30 and the first sub-pixel 20 are arranged to share a common side, then the other of the two second sub-pixels 30 should be arranged to share a common side with the third sub-pixel 40. And, if the two second sub-pixels 30 are left-right symmetrical to constitute the second sub-pixel unit 50, then a fixed point may be set anywhere in the pixel unit 10, and straight lines, which each connect the fixed point and one point on each of the three sides of the triangle, divide the pixel unit 10 into the first sub-pixel 20, the second sub-pixel unit 50, and the third sub-pixel 40. Then a straight line, which connects the fixed point and a vertex of the second sub-pixel unit 50, divides the second sub-pixel unit 50 into two second sub-pixels 30. The point on each of the three sides refers to any point on the three sides of the triangle other than any vertex. In some embodiments, the point on each of the three sides is a midpoint of each of the three sides of the triangle.

In an embodiment, adjacent pixel units 10 may be joined together through a same sub-pixel unit or a same sub-pixel. That is, in adjacent pixel units 10, the first sub-pixels 20 are spliced together. Or the second sub-pixels 30 are spliced together, that is, the second sub-pixel units 50 are spliced together. Or the third sub-pixels 40 are spliced together. For example, if the pixel structure in this embodiment includes two pixel units, namely a first pixel unit and a second pixel unit, and the first pixel unit is adjacent and joined to the second pixel unit, then, when the first pixel unit is joined to the second pixel unit, the first sub-pixel in the first pixel unit is joined to the first sub-pixel in the second pixel unit. Alternatively, the third sub-pixel in the first pixel unit is joined to the third sub-pixel in the second pixel unit. Alternatively, the second sub-pixel in the first pixel unit is joined to the second sub-pixel in the second pixel unit.

In an embodiment, as shown in FIG. 1, each pixel unit 10 has a shape of a right triangle, and specifically, an isosceles right triangle, and the first sub-pixel 20, the third sub-pixel 40, and the two second sub-pixels 30 of the second sub-pixel unit 50 in the pixel unit 10 have shapes of triangles with the same shape and the same area, and are all isosceles right triangles. The two second sub-pixels 30 are spliced to form the second sub-pixel unit 50 having a quadrilateral shape. And, in some embodiments, the first sub-pixel 20 is a red sub-pixel R, the second sub-pixel 30 is a green sub-pixel G, and the third sub-pixel 40 is a blue sub-pixel B. The second sub-pixel unit 50 includes two second sub-pixels 30, that is, the second sub-pixel unit 50 includes two green sub-pixels G.

Specifically, in each pixel unit 10 of the pixel structure 100 of this embodiment, the two second sub-pixels 30 are symmetrically arranged in the up-down direction and joined to form the second sub-pixel unit 50 with the quadrilateral shape, the first sub-pixel 20 is joined to a lower second sub-pixel 30, and the blue sub-pixel 40 is also joined to the lower second sub-pixel 30. If the first sub-pixel 20 is joined to one side of the lower second sub-pixel 30, then the third sub-pixel 40 is joined to another side of the lower second sub-pixel 30, that is, the first sub-pixel 20 and the third sub-pixel 40 are symmetrically distributed with respect to the lower second sub-pixel 30.

In other words, the coinciding and joined sides of the two second sub-pixels 30 are in a straight line, that is, either of the coinciding and joined sides is a diagonal line of the second sub-pixel unit 50 and bisects the second sub-pixel unit 50 to obtain two second sub-pixels 30. Between two sides of one second sub-pixel 30, which do not coincide with and are not joined to the other second sub-pixel 30, one side coincides with and is joined to the first sub-pixel 20, and another side coincides with and is joined to the third sub-pixel 40. The first sub-pixel 20 and the third sub-pixel 40 are symmetrically distributed with respect to the second sub-pixel 30 below the coinciding sides of the two second sub-pixels 30, that is, one second sub-pixel 30 in the second sub-pixel unit 50 is arranged between the first sub-pixel 20 and the third sub-pixel 40, and these three sub-pixels form an integral structure, and the other second sub-pixel 30 is arranged on a side of the integral structure, namely a side of the second sub-pixel 30 disposed between the first sub-pixel 20 and the third sub-pixel 40. The shapes and areas of the first sub-pixel 20, the two second sub-pixels 30, and the third sub-pixel 40 in each pixel unit are identical, respectively.

In this embodiment, by means of designing a red sub-pixel, two green sub-pixels, and a blue sub-pixel and by means of combining an algorithm, the red sub-pixel and the blue sub-pixel are configured to be shared sub-pixel units, and together with the two green sub-pixels, form a smallest pixel unit in a RGGB, so that the smallest pixel unit may be divided into two display pixel units. Compared with the conventional smallest pixel unit of a RGB form having only one display pixel unit, the smallest pixel unit of the present application enables the resolution of the pixel structure to be greatly improved.

Figure 2:
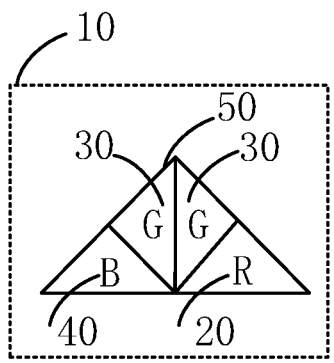
FIG. 2 is a schematic structural diagram illustrating a pixel unit in which the shape of each sub-pixel is an equilateral triangle in another embodiment.

In another embodiment, as shown in FIG. 2, similarly, each pixel unit 10 has a shape of a right triangle and an isosceles right triangle, and the first sub-pixel 20, the third sub-pixel 40, and the two second sub-pixels 30 of the second sub-pixel unit 50 in the pixel unit 10 have shapes of triangles with the same shape and the same area, and all have shapes of isosceles right triangles. The two second sub-pixels 30 are spliced to form a second sub-pixel unit 50 having a quadrilateral shape. And, in some embodiments, the first sub-pixel 20 is a red sub-pixel R, the second sub-pixel 30 is a green sub-pixel G, and the third sub-pixel 40 is a blue sub-pixel B. The second sub-pixel unit 50 includes two second sub-pixels 30, that is, the second sub-pixel unit 50 includes two green sub-pixels G. However, the two second sub-pixels 30 are spliced symmetrically in the left-right direction to form the second sub-pixel unit 50 with a quadrilateral shape.

Specifically, in each pixel unit 10 of the pixel structure 100 of this embodiment, if the two second sub-pixels 30 are spliced symmetrically in the left-right direction to form the second sub-pixel unit 50 with a quadrilateral shape, then the first sub-pixel 20 and one of the two second sub-pixels 30 are joined and share a common side, and the third sub-pixel 40 and the other of the two second sub-pixels 30 are joined and share a common side. That is, any one of the two second sub-pixels 30 and the first sub-pixel 20 are joined and share a common side, then the other second sub-pixel 30 and the third sub-pixel 40 should be joined and share a common side. That is, the two second sub-pixels 30 are both disposed between the first sub-pixel 20 and the third sub-pixel 40, which means that the second sub-pixel unit 50 is disposed between the first sub-pixel 20 and the third sub-pixel 40. That is, the first sub-pixel 20 and the third sub-pixel 40 are symmetrically distributed with respect to the two second sub-pixels 30. The coinciding and joined sides of the two second sub-pixels 30 are in a straight line, and similarly, either of the coinciding and joined sides is a diagonal line of the second sub-pixel unit 50, and bisects the second sub-pixel unit 50 to obtain two second sub-pixels 30. The first sub-pixel 20 coincides with and is joined to one side between two disconnected sides of one second sub-pixel 30, and the third sub-pixel 40 coincides with and is joined to one side between the two disconnected sides of the other second sub-pixel 30. That is, the first sub-pixel 20 and the third sub-pixel 40 are symmetrically distributed with respect to the two second sub-pixels 30, and the first sub-pixel 20 is disposed on a side of the one second sub-pixel 30, and the third sub-pixel 40 is disposed on a side of the other second sub-pixel 30. In this embodiment, the shapes and areas of the first sub-pixel 20, the two second sub-pixels 30, and the third sub-pixel 40 in each pixel unit 10 are all identical respectively.

In this embodiment, similarly, by means of designing a red sub-pixel, two green sub-pixels, and a blue sub-pixel and by means of combining an algorithm, the red sub-pixel and the blue sub-pixel are configured to be shared sub-pixel units, and together with the two green sub-pixels, form a smallest pixel unit of the RGGB form, so that the smallest pixel unit may be divided into two display pixel units. Compared with the conventional smallest pixel unit of the RGB form having only one display pixel unit, the smallest pixel unit of the present application enables the resolution of the pixel structure to be greatly improved.

Figure 3:
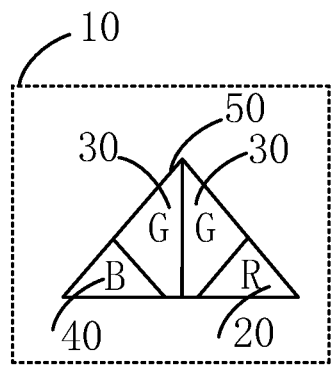
FIG. 3 is a schematic structural diagram illustrating a pixel unit in which a shape of a second sub-pixel unit is a pentagon in an embodiment.

In an embodiment, as shown in FIG. 3, each pixel unit 10 also has a shape of a right triangle and an isosceles right triangle, but the first sub-pixel 20 and the third sub-pixel 40 in the pixel unit 10 have shapes of triangles with the same shape and the same area, and the two second sub-pixels 30 have quadrilateral shapes with the same shape and the same area, and the two second sub-pixels 30 are spliced to form a second sub-pixel unit 50 having a shape of a pentagon. And, in some embodiments, the first sub-pixel 20 is a red sub-pixel R, the second sub-pixel 30 is a green sub-pixel G, and the third sub-pixel 40 is a blue sub-pixel B. The second sub-pixel unit 50 includes the two second sub-pixels 30, that is, the second sub-pixel unit 50 includes two green sub-pixels G.

Specifically, in each pixel unit 10 of the pixel structure 100 of this embodiment, the two second sub-pixels 30 are also spliced symmetrically in the left-right direction to form the second sub-pixel unit 50 with the shape of the pentagon, and the first sub-pixel 20 and one of the two second sub-pixels 30 are joined and share a common side, and the third sub-pixel 40 and the other of the two second sub-pixels 30 are joined and share a common side. That is, any one of the two second sub-pixels 30 and the first sub-pixel 20 are arranged to share a common side, the other second sub-pixel 30 should be arranged to share a common side with the third sub-pixel 40. That is, the two second sub-pixels 30 are both disposed between the first sub-pixel 20 and the third sub-pixel 40, which means that the second sub-pixel unit 50 is disposed between the first sub-pixel 20 and the third sub-pixel 40. That is, the first sub-pixel 20 and the third sub-pixel 40 are symmetrically distributed with respect to the two second sub-pixels 30. In other words, the coinciding and joined sides of the two second sub-pixels 30 are in a straight line, and similarly, either of the coinciding and joined sides is a diagonal line of the second sub-pixel unit 50, and bisects the second sub-pixel unit 50 to obtain two second sub-pixels 30. The first sub-pixel 20 coincides with and is joined to one side between two disconnected sides of one second sub-pixel 30, and the third sub-pixel 40 coincides with and is joined to one side between the two disconnected sides of the other second sub-pixel 30. That is, the first sub-pixel 20 and the third sub-pixel 40 are symmetrically distributed with respect to the two second sub-pixels 30, and the first sub-pixel 20 is disposed on a side of the one second sub-pixel 30, and the third sub-pixel 40 is disposed on a side of the other second sub-pixel 30.

In this embodiment, similarly, by means of designing a red sub-pixel, two green sub-pixels, and a blue sub-pixel and by means of combining an algorithm, the red sub-pixel and the blue sub-pixel are configured to be shared sub-pixel units, and together with the two green sub-pixels, form a smallest pixel unit of the RGGB form, so that the smallest pixel unit may be divided into two display pixel units. Compared with the conventional smallest pixel unit of the RGB form having only one display pixel unit, the smallest pixel unit of the present application enables the resolution of the pixel structure to be greatly improved.

Figure 4:
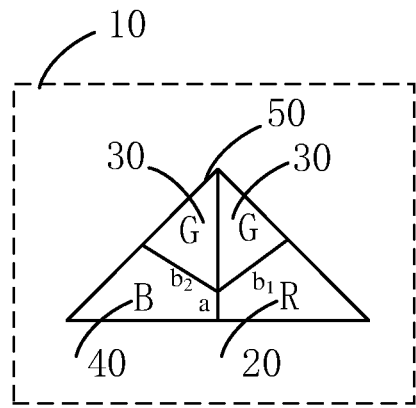
FIG. 4 is a schematic structural diagram illustrating a pixel unit in which a shape of a first sub-pixel and a shape of a third sub-pixel are quadrangles in another embodiment.

In an embodiment, as shown in FIG. 4, each pixel unit 10 also has a shape of a right triangle and an isosceles right triangle, but the first sub-pixel 20 and the third sub-pixel 40 in the pixel unit 10 have quadrilateral shapes with the same shape and the same area. The two second sub-pixels 30 have shapes of triangles with the same shape and the same area, and the two second sub-pixels 30 are spliced to form a second sub-pixel unit 50 having a quadrilateral shape. And, in some embodiments, the first sub-pixel 20 is a red sub-pixel R, the second sub-pixel 30 is a green sub-pixel G, and the third sub-pixel 40 is a blue sub-pixel B. The second sub-pixel unit 50 includes the two second sub-pixels 30, that is, the second sub-pixel unit 50 includes two green sub-pixels G.

Specifically, in this embodiment, a fixed point is set in each pixel unit 10 of the pixel structure 100, and straight lines, which each connect the fixed point and one point on each of the three sides of the triangle, divide the pixel unit 10 into the first sub-pixel 20, the second sub-pixel unit 50, and the third sub-pixel 40. Then a straight line, which connects the fixed point and a vertex of the second sub-pixel unit 50, divides the second sub-pixel unit 50 into two second sub-pixels 30. The two second sub-pixels 30 are also symmetrically arranged in the left-right direction and are spliced by sharing a common side to form the second sub-pixel unit 50 with the quadrilateral shape. The first sub-pixel 20 and the third sub-pixel 40 are spliced to form an intersecting side a, and the intersecting side a has two adjacent sides $b_1$, $b_2$, and one adjacent side $b_1$ of the two adjacent sides $b_1$, $b_2$ is a side of the first sub-pixel 20, and the other adjacent side $b_2$ thereof is a side of the third sub-pixel 40. Then, between two corresponding adjacent sides $b_1$, $b_2$ of the second sub-pixel unit 50, one adjacent side $b_1$ intersects the intersecting side a formed by splicing the first sub-pixel 20 and the third sub-pixel 40, and the other adjacent side $b_2$ also intersects with the intersecting side a formed by splicing the first sub-pixel 20 and the third sub-pixel 40. Since the second sub-pixel unit 50 is formed by splicing the two second sub-pixels 30, the two corresponding adjacent sides $b_1$, $b_2$ of the second sub-pixel unit 50 are two sides of the two second sub-pixels 30, respectively, that is, one side $b_1$ of the two corresponding adjacent sides $b_1$, $b_2$ is a side of one of the two second sub-pixels 30, and the other side $b_2$ thereof is a side of the other second sub-pixel 30. In other words, that the second sub-pixel unit 50 is joined to the first sub-pixel 20 and the third sub-pixel 40 respectively means that one of the two second sub-pixels 30 is joined to the first sub-pixel 20, and the other second sub-pixel 30 is joined to the third sub-pixel 40. Similarly, the coinciding and joined sides of the two second sub-pixels 30 are in a straight line, that is, either of the coinciding and joined sides is a diagonal line of the second sub-pixel unit 50, and bisects the second sub-pixel unit 50 to obtain the two second sub-pixels 30.

In this embodiment, similarly, by means of designing a red sub-pixel, two green sub-pixels, and a blue sub-pixel and by means of combining an algorithm, the red sub-pixel and the blue sub-pixel are configured to be shared sub-pixel units, and together with the two green sub-pixels, form a smallest pixel unit of the RGGB, so that the smallest pixel unit may be divided into two display pixel units. Compared with the conventional smallest pixel unit of the RGB form having only one display pixel unit, the smallest pixel unit of the present application enables the resolution of the pixel structure to be greatly improved.

In an embodiment, each two of the plurality of second sub-pixel units 50 of the plurality of pixel units 10 share a common side to form a pixel set 102 including the plurality of pixel units. In the pixel set 102, each two adjacent pixel units 10 are joined by same sub-pixels, and each two adjacent pixel sets 102 are joined by same sub-pixels. Being joined by the same sub-pixels means: being joined by same first sub-pixels, being joined by same second sub-pixels, or being joined by same third sub-pixels.

Specifically, the pixel set 102 is formed by splicing a plurality of pixel units 10, especially, formed by means of each two of the second sub-pixel units 50 in the pixel units 10 sharing a common side, that is, in the pixel set 102, the adjacent first sub-pixel units 50 share the common side. And, in each pixel set 102, in any adjacent pixel units 10, the first sub-pixel 20 of one the pixel unit 10 and the first sub-pixel 20 of the other the pixel unit 10 are joined and share a common side, and the second sub-pixel 30 of one pixel unit 10 and the second sub-pixel 30 of the other pixel unit 10 are joined and share a common side. Or, the third sub-pixel 40 of one pixel unit 10 and the third sub-pixel 40 of the other pixel unit 10 are joined and share a common side, and the second sub-pixel 30 of one pixel unit 10 and the second sub-pixel 30 of the other pixel unit 10 are joined and share a common side.

Similarly, a plurality of pixel sets 102 are arranged to form the pixel structure 100, and in any adjacent pixel sets 102, the first sub-pixel 20 of one pixel set 102 and the first sub-pixel 20 of the other pixel set 102 are joined and share a common side. Or, the third sub-pixel 40 of one pixel set 102 and the third sub-pixel 40 of the other pixel set 102 are joined and share a common side.

Figure 5:
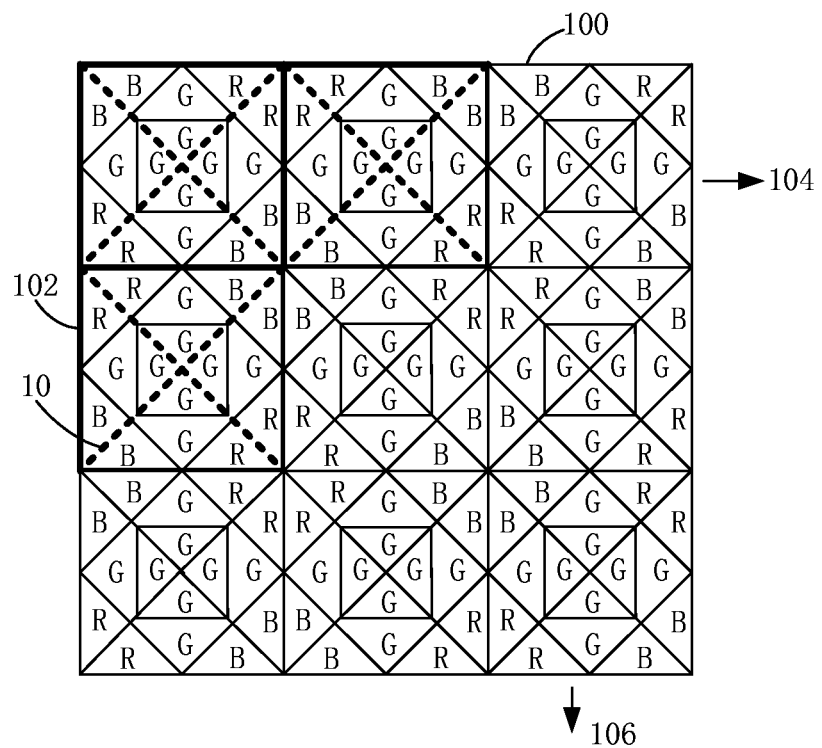
FIG. 5 is a schematic structural diagram illustrating a pixel structure of a first embodiment.
Figure 6:
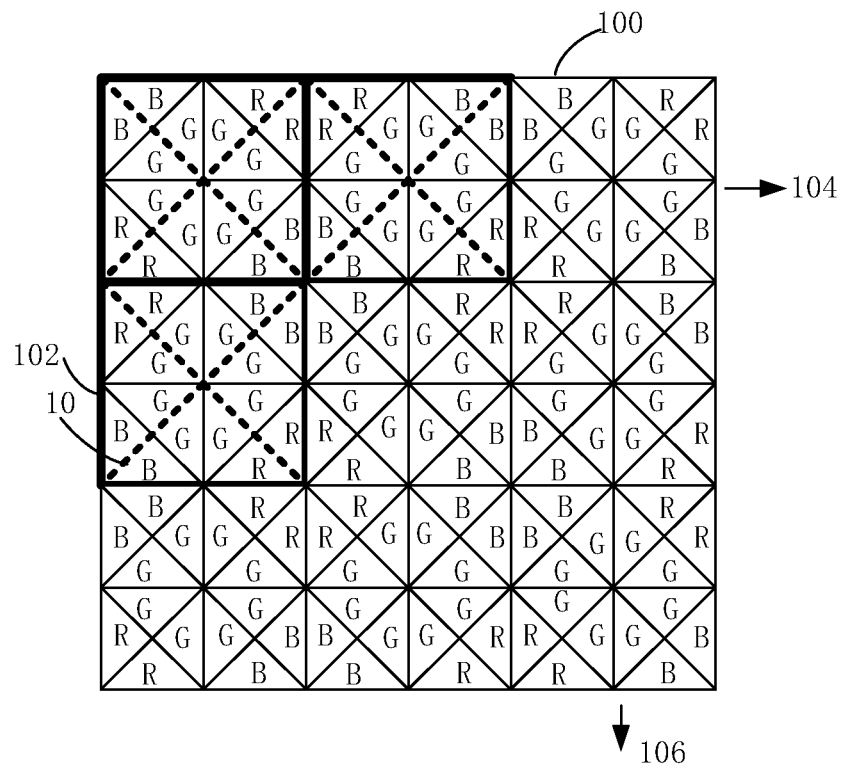
FIG. 6 is a schematic structural diagram illustrating a pixel structure of a second embodiment.
Figure 7:
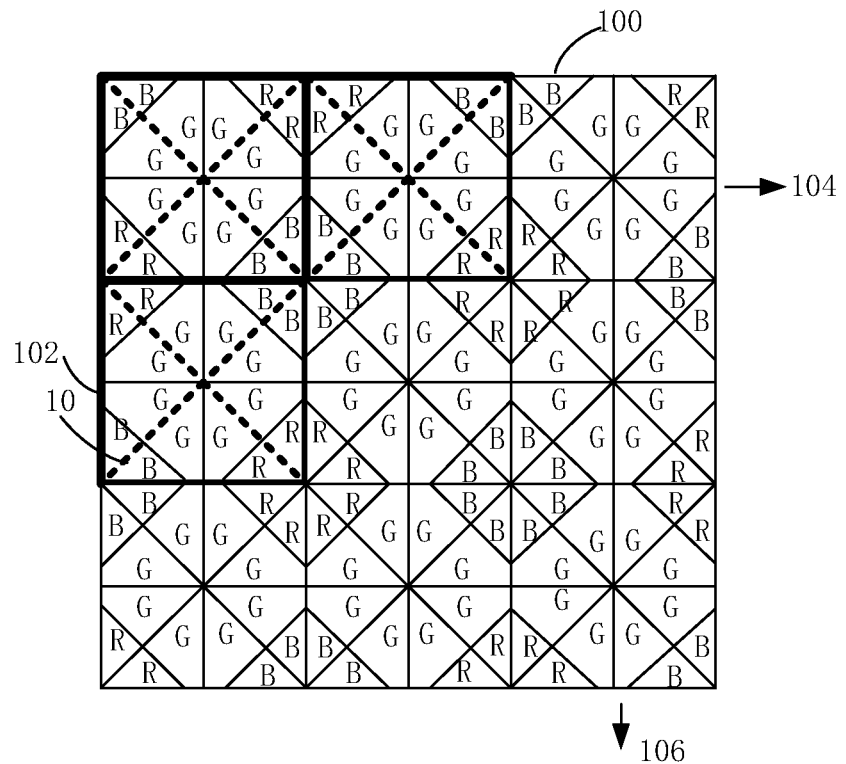
FIG. 7 is a schematic structural diagram illustrating a pixel structure of a third embodiment.
Figure 8:
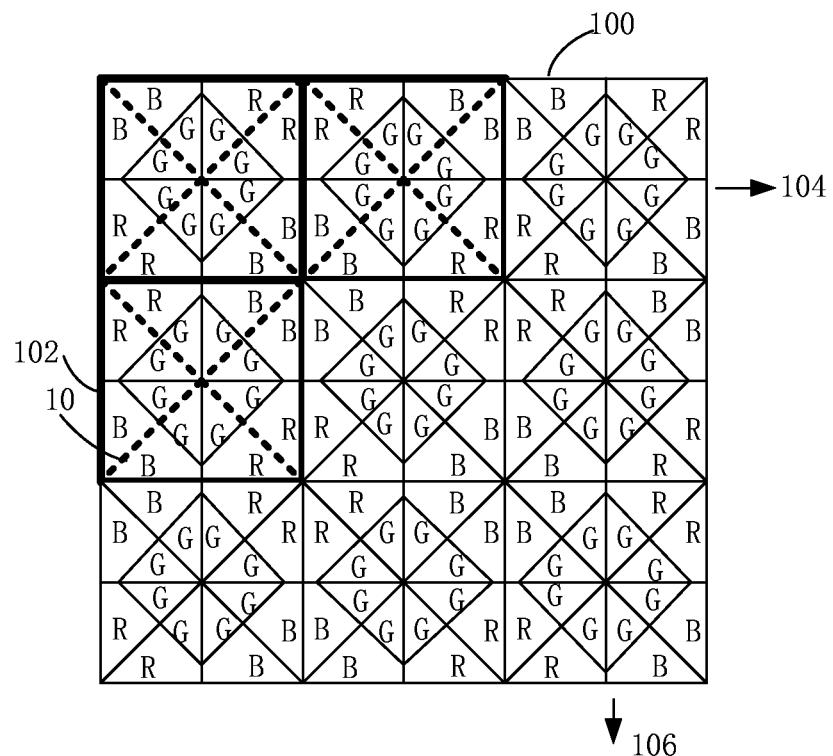
FIG. 8 is a schematic structural diagram illustrating a pixel structure of a fourth embodiment.

In an embodiment, as shown in FIGS. 5-8, the pixel unit 10 has a shape of a right triangle, and the right angle of the right triangle is an included angle between the two intersecting sides of the second sub-pixel unit 50 that constitute an outer contour of the pixel unit 10. That is, each two of the second sub-pixel units 50 of the four pixel units 10 share a common side to form the pixel set 102 having a quadrilateral shape. A structure of the pixel unit 10 of FIG. 5 is shown in FIG. 1, the structure of the pixel unit 10 of FIG. 6 is shown in FIG. 2, the structure of the pixel unit 10 of FIG. 7 is shown in FIG. 3, and the structure of the pixel unit 10 of FIG. 8 is shown in FIG. 4.

Specifically, referring to FIGS. 5 to 8, the pixel unit 10 has a shape of a right triangle, and the right angle of the right triangle is an included angle between the two intersecting sides of the second sub-pixel unit 50 that constitute the outer contour of the pixel unit 10. Each two of the second sub-pixel units 50 of the four pixel units 10 share a common side to form the pixel set 102 having a quadrilateral shape. In the horizontal direction, the pixel sets 102 are arranged to form a pixel row 104, and in the pixel row 104, any two adjacent pixel sets 102 are joined by means of the same sub-pixels. That is, in the horizontally adjacent pixel sets 102, the first sub-pixel 20 of one pixel set 102 and the first sub-pixel 20 of the other pixel set 102 are joined and share a common side, and the third sub-pixel 40 of the one pixel set 102 and the third sub-pixel 40 of the other pixel set 102 are joined and share a common side. Or, the first sub-pixel 20 of one pixel set 102 and the first sub-pixel 20 of the other pixel set 102 are joined and share a common side, the third sub-pixel 40 of the one pixel set 102 and the third sub-pixel 40 of the other pixel set 102 are joined and share a common side, and the second sub-pixel 30 of the one pixel set 102 and the second sub-pixel 30 of the other pixel set 102 are joined and share a common side.

In a vertical direction, a plurality of pixel sets 102 are arranged to form a pixel column 106, and in the pixel column 106, any two adjacent pixel sets 102 are joined by the mean of same sub-pixels. That is, in the vertically adjacent pixel sets 102, the first sub-pixel 20 of one pixel set 102 and the first sub-pixel 20 of the other pixel set 102 are joined and share a common side, and the third sub-pixel 40 of the one pixel set 102 and the third sub-pixel 40 of the other pixel set 102 are joined and share a common side. Or, the first sub-pixel 20 of the one pixel set 102 and the first sub-pixel 20 of the other pixel sets 102 are joined and share a common side, the third sub-pixel 40 of the one pixel sets 102 and the third sub-pixel 40 of the other pixel sets 102 are joined and share a common side, and the second sub-pixel 30 of the one pixel sets 102 and the second sub-pixel 30 of the other pixel sets 102 are joined and share a common side. That is, being joined by means of the same sub-pixels means, being joined by means of same-colored-light sub-pixels. The first sub-pixel 20 corresponds to the red sub-pixel R, the second sub-pixel 30 corresponds to the green sub-pixel G, and the third sub-pixel 40 corresponds to the blue sub-pixel B. For example, for any adjacent pixel units 10 and any adjacent pixel sets 102, the red sub-pixel R is adjacently joined to the red sub-pixel R, the green sub-pixel G is adjacently joined to the green sub-pixel G, or the blue sub-pixel B is adjacently joined to the blue sub-pixel B.

Figure 9:
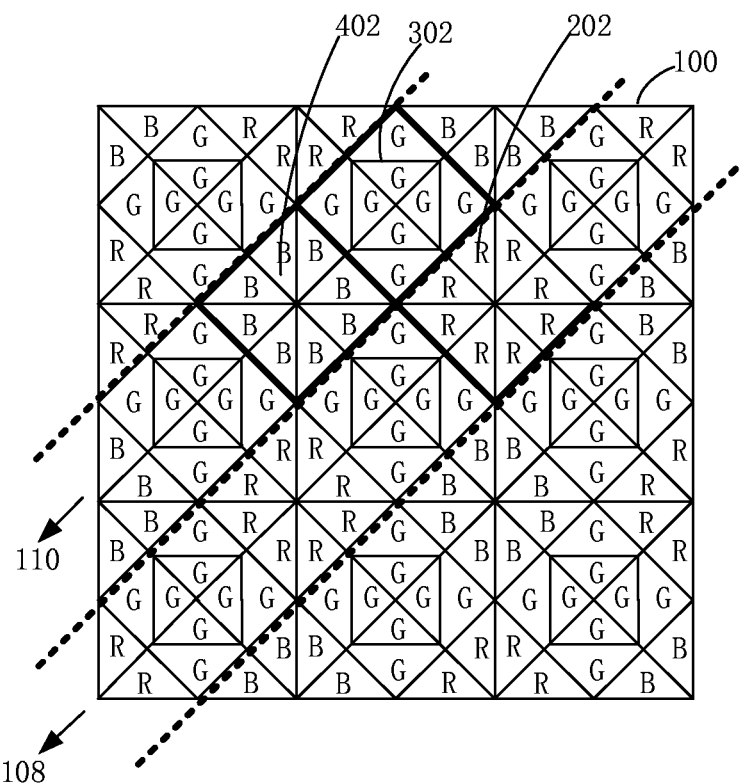
FIG. 9 is a schematic structural diagram illustrating a pixel structure of a fifth embodiment.
Figure 10:
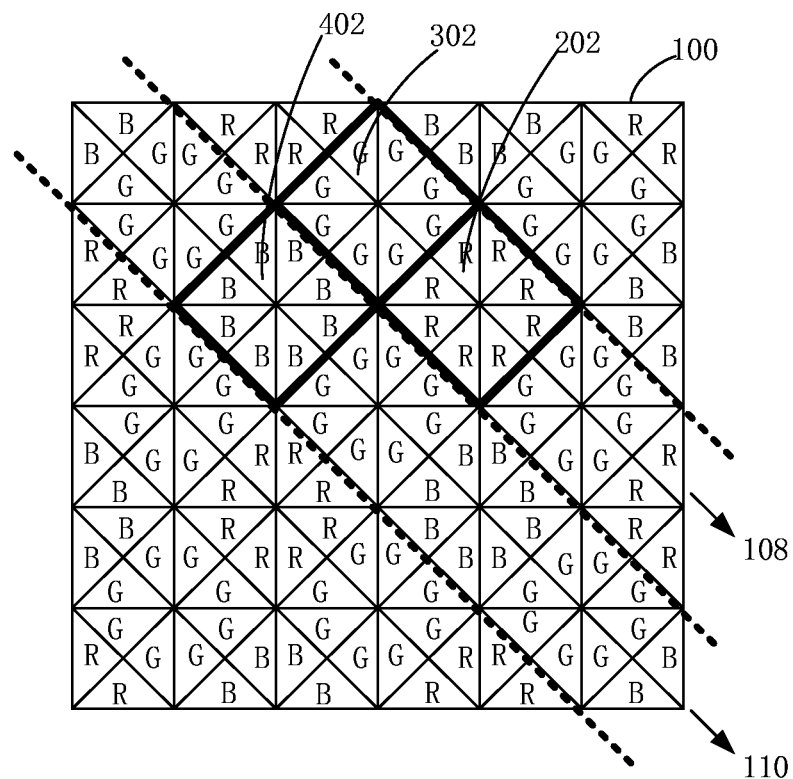
FIG. 10 is a schematic structural diagram illustrating a pixel structure of a sixth embodiment.

In an embodiment, referring to FIGS. 9 and 10, any two of the same sub-pixels in any adjacent pixel units 10 share a common side, forming a plurality of first sub-pixel groups 202 each including the first sub-pixels 10, a plurality of second sub-pixel groups 302 each including the second sub-pixels 30, and a plurality of third sub-pixel groups 402 each including the third sub-pixels 40. The plurality of first sub-pixel groups, the plurality of second sub-pixel groups, and the plurality of third sub-pixel groups constitute a pixel structure 100. The first sub-pixel groups 202 and the second sub-pixel groups 302 are arranged alternately in a first direction to form a first pixel group 108, and the second sub-pixel groups 302 and the third sub-pixel groups 402 are arranged alternately in the first direction to form a second pixel group 110. The first pixel group 108 and the second pixel group 110 are alternately arranged in a second direction, and the second sub-pixel groups 302 in any adjacent the first pixel group 108 and the second pixel group 110 are arranged in a staggered manner, and the first direction intersects with the second direction.

The area and size of the first sub-pixel group 202 and the area and size of the second sub-pixel group 302 in the first pixel group 108 may be identical or different. Similarly, the area and size of the third sub-pixel group 402 and the area and size of the second pixel group 302 in the second pixel group 110 may be identical or different. And, the areas and sizes of the first sub-pixel group 202, the second sub-pixel group 302, and the third sub-pixel group 402 may be identical or different. The first direction and the second direction refer to the directions represented by two intersecting straight lines.

In an embodiment, as shown in FIGS. 9-12, the pixel unit 10 has a shape of a right triangle, and the right angle of the right triangle is the included angle between the two intersecting sides of the second sub-pixel unit 50. And, the first sub-pixel group 202 is formed by splicing eight first sub-pixels 20; the second sub-pixel group 302 is formed by splicing eight second sub-pixels 30; and the third sub-pixel 402 is formed by splicing eight third sub-pixels 40. Each two adjacent first sub-pixels 20 in the first sub-pixel group 202 share a common side. Each two adjacent second sub-pixels 30 in the second sub-pixel group 302 share a common side. Each two adjacent third sub-pixels 40 in the third sub-pixel group 402 share a common side.

Since the first sub-pixel 20, the second sub-pixel 30, and the third sub-pixel 40 are respectively a red sub-pixel R, a green sub-pixel G, and a blue sub-pixel B, then the first sub-pixel group 202, the second sub-pixel group 302, and the third sub-pixel group 402 are respectively a red sub-pixel group 202, a green sub-pixel group 302, and a blue sub-pixel group 402. That is, the red sub-pixel group 202 is formed by splicing eight red sub-pixels R, the green sub-pixel group 302 is formed by splicing eight green sub-pixels G, and the blue sub-pixel group 402 is formed by splicing eight blue sub-pixels B.

The ratio of the number of the red sub-pixel groups 202 to the number of the green sub-pixel groups 302 to the number of the blue sub-pixel groups 402 in the pixel structure 100 is 1:2:1. Since each sub-pixel group in the pixel structure is formed by joining eight sub-pixels having the same colored-light, actual production of the pixel structure 100 corresponds to dividing a complete colored-light sub-pixel into a plurality of colored-light sub-pixels having the same shape and the same area. The resolution is improved by increasing the number of sub-pixels and reducing the area of the sub-pixels under the same total area. Through a resolution test, the resolution of the pixel structure with an arrangement of this embodiment may be increased by about 12 times. In addition, during the evaporation process, the red sub-pixel group 202, the green sub-pixel group 302, and the blue sub-pixel group 402 may share one opening, which may be used for the ink deposition area during the printing process.

Specifically, referring to FIG. 9, the red sub-pixel group 202 in the pixel structure 100 is formed by joining eight red sub-pixels R arranged radially. A plurality of red sub-pixels R arranged radially refers to the plurality of red sub-pixels R arranged along a circle relative to a central point. The green sub-pixel group 302 is formed by eight green sub-pixels G. First, four green sub-pixels G are spliced to form a quadrilateral, and then the other four green sub-pixels G are respectively joined to four sides of the quadrilateral to form the green sub-pixel group 302. The blue sub-pixel group 402 is formed by joining eight blue sub-pixels B arranged radially. A plurality of blue sub-pixels B arranged radially refers to the plurality of blue sub-pixels B arranged along a circle relative to a central point. The sub-pixel groups have quadrilateral shapes with the same shape and the same area. Taking the directions represented by two perpendicular sides of the second sub-pixel in an isosceles right-angled pixel unit as an example, the first sub-pixel group 202 and the second sub-pixel group 302 are arranged alternately in a first direction to form the first pixel group 108, and the third sub-pixel group 402 and the second sub-pixel group 302 are also arranged alternately in the first direction to form the second pixel group 110. In addition, in a second direction perpendicular to the first direction, the first pixel group 108 and the second pixel group 110 are alternately arranged to form the pixel structure 100, and the second sub-pixel groups 302 in the adjacent first pixel group 108 and second pixel group 110 are arranged in a staggered manner. That is, the red sub-pixel group 202 is joined to the green sub-pixel group 302, the blue sub-pixel group 402 is joined to the green sub-pixel group 302, and the red sub-pixel group 202 and the blue sub-pixel group 402 are symmetrically distributed relative to the green sub-pixel group 302. When the first pixel group 108 and the second pixel group 110 are alternately arranged in the second direction to form the pixel structure 100, naturally, the first pixel group 108 and the second pixel group 110 are also alternately arranged in the first direction. In this embodiment, eight red pixel units 20 arranged radially forms the red sub-pixel group 202, and eight blue pixel units 40 arranged radially forms the blue sub-pixel group 402. Four green sub-pixel units are joined to form a quadrilateral shape, and another four green sub-pixel units are respectively joined to four sides of the quadrilateral shape to form the green sub-pixel group 302, which makes it convenient to divide each sub-pixel group in the pixel structure into a plurality of smallest pixel units with the form RGGB, thereby improving the resolution.

Figure 11:
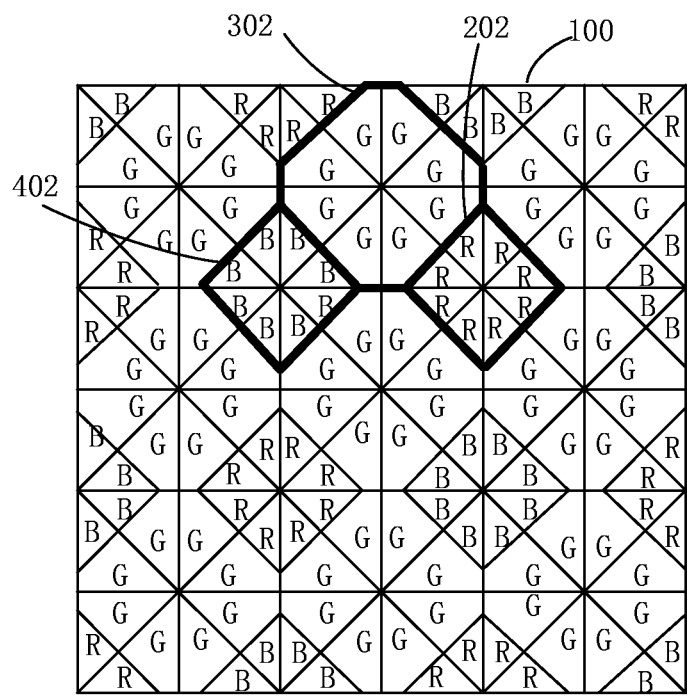
FIG. 11 is a schematic structural diagram illustrating a pixel structure of a seventh embodiment.
Figure 12:
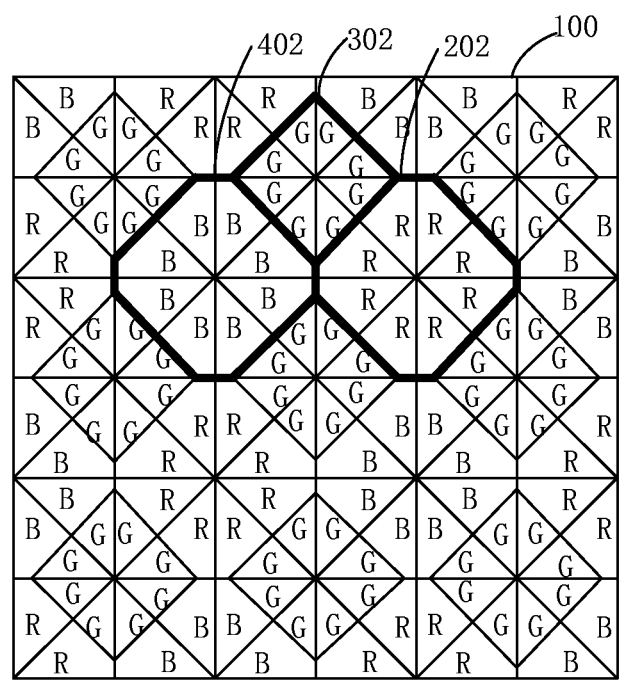
FIG. 12 is a schematic structural diagram illustrating a pixel structure of an eighth embodiment.

Referring to FIGS. 10-12, the red sub-pixel group 202 in the pixel structure 100 is formed by joining eight red sub-pixel units R arranged radially. The green sub-pixel group 302 is formed by joining eight green sub-pixel units G arranged radially. A plurality of green sub-pixel units G arranged radially refers to the plurality of green sub-pixel units G arranged along a circle relative to a central point. The blue sub-pixel group 402 is formed by joining eight blue sub-pixel units 40 arranged radially.

The sub-pixel groups in FIG. 10 have quadrilateral shapes with the same shape and the same area, the red sub-pixel group 202 and the blue sub-pixel group 402 in FIG. 11 have quadrilateral shapes with the same shape and the same area, and the green sub-pixel group 302 has a shape of Octagon. The red sub-pixel group 202 and the blue sub-pixel group 402 in FIG. 12 have octagonal shapes with the same shape and the same area, and the green sub-pixel group 302 has a quadrilateral shape.

In FIGS. 10-12, the first sub-pixel group 202 and the second sub-pixel group 302 are arranged alternately in the first direction to form the first pixel group 108, and the third sub-pixel group 402 and the second sub-pixel group 302 are also arranged alternately in the first direction to form the second pixel group 110. In addition, the first pixel group 108 and the second pixel group 110 are alternately arranged in the second direction to form the pixel structure 100, and the second sub-pixel groups 302 in the adjacent first pixel group 108 and second pixel group 110 are arranged in a staggered manner, so as to form the pixel structure 100. That is, the red sub-pixel group 202 is joined to the green sub-pixel group 302, the blue sub-pixel group 402 is joined to the green sub-pixel group 302, and the red sub-pixel group 202 and the blue sub-pixel group 402 are symmetrically distributed with respect to the green sub-pixel group 302.

In this embodiment, the plurality of red sub-pixels arranged radially, the plurality of green sub-pixels arranged radially, and the plurality blue sub-pixels arranged radially form a red sub-pixel group 202, a green sub-pixel group 302, and a blue sub-pixel group, respectively, which make it convenient to divide each sub-pixel group in the pixel structure into a plurality of smallest pixel units with the RGGB form, thereby improving the resolution.

In an embodiment, the pixel structure 100 further includes a first pixel defining layer and a second pixel defining layer. The red sub-pixel group, the green sub-pixel group, and the blue sub-pixel group are separated by the first pixel defining layer. Each of the adjacent red sub-pixel units, each of the adjacent green sub-pixel units, and each of the adjacent blue sub-pixel units are separated by the second pixel defining layer.

The pixel defining layer is configured to separate each of the sub-pixel groups. In this embodiment, the first pixel defining layer is configured to separate adjacent sub-pixel groups having different colored-light, and the second pixel defining layer is configured to separate adjacent sub-pixel units having the same colored-light. And, in this embodiment, a height of the first pixel defining layer is greater than a height of the second pixel defining layer.

Specifically, the first pixel defining layer is disposed between the pixel groups having different colored-light, and is configured to separate the pixel groups having different colored-light. That is, the first pixel defining layer is disposed between the red sub-pixel group 202 and the green sub-pixel group 302, between the red sub-pixel group 202 and the blue sub-pixel group 402, and between the green sub-pixel group 302 and the blue sub-pixel group 402 to separate them from each other. The second pixel defining layer is disposed between adjacent red sub-pixel units R, between the adjacent green sub-pixel units G, and between the adjacent blue sub-pixel units B to separate them from each other.

In an embodiment, a display panel is provided, and the display panel of this embodiment includes the pixel structure 100 described in any one of the above embodiments. In the display panel applying the pixel structure 100 in the present disclosure, by means of designing a red sub-pixel, two green sub-pixels, and a blue sub-pixel and by means of combining an algorithm, the red sub-pixel and the blue sub-pixel are configured to be shared sub-pixel units, and together with the two green sub-pixels, form a smallest pixel unit of the RGGB, so that the smallest pixel unit may be divided into two display pixel units. Compared with the conventional display panel having smallest pixel units of the RGB form having only one display pixel unit, the display panel of the present application has greatly improved the resolution thereof, thereby improving the display effects.

The technical features of the above-described embodiments may be combined arbitrarily. To simplify the description, not all possible combinations of the technical features in the above embodiments are described. However, all of the combinations of these technical features should be considered as within the scope of this disclosure, as long as such combinations do not contradict each other.

The above-described embodiments merely represent several embodiments of the present disclosure, and the descriptions thereof are more specific and detailed, but they should not be construed as limitation on the scope of the present disclosure. It should be noted that, for those of ordinary skill in the art, various modifications and improvements may be made without departing from the concept of the present disclosure, and these are all within the protection scope of the present disclosure. Therefore, the protection scope of the present disclosure shall be subject to the appended claims.

What is claimed is:
1. A pixel structure, comprising:
a plurality of pixel units, wherein:

each of the plurality of pixel units comprises four sub-pixels, and the four sub-pixels are one first sub-pixel, two second sub-pixels, and one third sub-pixel, respectively;

the two second sub-pixels share a common side to form a second sub-pixel unit;

the first sub-pixel and the third sub-pixel are disposed at two opposite sides of the second sub-pixel unit, respectively;

each of the plurality of pixel units has a shape of a triangle;

each two of the second sub-pixel units of the plurality of pixel units share a common side to form a pixel set comprising the plurality of pixel units;

in the pixel set, any two adjacent pixel units are joined by same sub-pixels; and any two adjacent pixel sets are joined by same sub-pixels;

each of the plurality of pixel units has a shape of a right triangle, and a right angle of the right triangle is an included angle between two intersecting sides of the second sub-pixel unit;

each two of the second sub-pixel units of four pixel units share a common side to form the pixel group having a quadrilateral shape;

in a horizontal direction, pixel sets are arranged to form a pixel row, and in the pixel row, any two adjacent pixel groups are joined by same sub-pixels; and in a vertical direction, pixel sets are arranged to form a pixel column, and in the pixel column, any two adjacent pixel groups are joined by same sub-pixels.

2. The pixel structure according to claim 1, wherein:

same sub-pixels are arranged along circles in the plurality of pixel units, and any adjacent two same sub-pixels in a circle shares a common side, forming a plurality of first sub-pixel groups each comprising the first sub-pixels arranged along a circle, a plurality of second sub-pixel groups each comprising the second sub-pixels arranged along a circle, and a plurality of third sub-pixel groups each comprising the third sub-pixels arranged along a circle;

the plurality of first sub-pixel groups, the plurality of second sub-pixel groups, and the plurality of third sub-pixel groups constitute the pixel structure;

the first sub-pixel groups and the second sub-pixel groups are arranged alternately in a first direction to form a first pixel group;

the second sub-pixel groups and the third sub-pixel groups are arranged alternately in the first direction to form a second pixel group;

the first pixel group and the second pixel group are alternately arranged in a second direction;

second sub-pixel groups in any adjacent the first pixel group the second pixel group are arranged in a staggered manner; and the first direction intersects with the second direction.

3. The pixel structure according to claim 2, wherein:

each of the first sub-pixel groups is formed by splicing eight first sub-pixels;

each of the second sub-pixel groups is formed by splicing eight second sub-pixels; and each of the third sub-pixel groups is formed by splicing eight third sub-pixels.

4. The pixel structure according to claim 1, wherein each of the pixel units has a shape of an isosceles right triangle.

5. The pixel structure according to claim 1, wherein the first sub-pixel is a red sub-pixel, the second sub-pixel is a green sub-pixel, and the third sub-pixel is a blue sub-pixel.

6. The pixel structure according to claim 1, wherein the two second sub-pixels in each of the pixel units are symmetrically distributed.

7. The pixel structure according to claim 6, wherein the first sub-pixel and the third sub-pixel in each of the pixel units are symmetrically distributed with respect to the second sub-pixel unit.

8. The pixel structure according to claim 1, wherein:

the first sub-pixel has a shape of a triangle, the second sub-pixel unit has a shape of a quadrilateral, and the third sub-pixel has a shape of a triangle; or the first sub-pixel has a shape of a triangle, the second sub-pixel unit has a shape of a pentagon, and the third sub-pixel has a shape of a triangle; or the first sub-pixel, the second sub-pixel unit, and the third sub-pixel each have a shape of a quadrilateral.

9. The pixel structure according to claim 1, wherein:

in each of the plurality of pixel units, one second sub-pixel is disposed between the first sub-pixel and the third sub-pixel to form an integral structure, and another second sub-pixel is disposed on one side of the integral structure; or the two second sub-pixels are both disposed between the first sub-pixel and the third sub-pixel, and one second sub-pixel and the first sub-pixel are arranged to share a common side, another second sub-pixel and the third sub-pixel are arranged to share a common side.

10. The pixel structure according to claim 1, wherein:

the first sub-pixel, the second sub-pixel, and the third sub-pixel have shapes of isosceles right triangles with a same shape and a same area; or the first sub-pixel and the third sub-pixel have shapes of isosceles right triangles with a same area, and the two second sub-pixels have quadrilateral shapes with a same shape and a same area; or the first sub-pixel and the third sub-pixel have quadrilateral shapes with a same shape and a same area, and the two second sub-pixels have triangular shapes with a same shape and a same area.

11. The pixel structure according to claim 2, wherein the first direction is perpendicular to the second direction.

12. The pixel structure according to claim 7, wherein in each of the plurality of pixel units, the first sub-pixel is disposed on a side of one second sub-pixel, and the third sub-pixel is disposed on a side of another second sub-pixel.

13. The pixel structure according to claim 7, wherein in each of the plurality of pixel units, the two second sub-pixels are both disposed between the first sub-pixel and the third sub-pixel.

14. A display panel comprising the pixel structure of claim 1.

15. A pixel structure, comprising a plurality of pixel units, wherein:

each of the pixel units comprises four sub-pixels, and the four sub-pixels are one first sub-pixel, two second sub-pixels, and one third sub-pixel, respectively;

the two second sub-pixels share a common side to form a second sub-pixel unit;

the first sub-pixel and the third sub-pixel are disposed at two opposite sides of the second sub-pixel unit, respectively;

each of the pixel units has a shape of a triangle;

a fixed point is set in each of the pixel units, and straight lines each connecting the fixed point and a point on each of three sides of the triangle divide each of the pixel units into the first sub-pixel, the second sub-pixel unit, and the third sub-pixel, and a straight line connecting the fixed point and a vertex of the second sub-pixel unit divides the second sub-pixel unit into the two second sub-pixels; and the point on each of the three sides of the triangle is a midpoint of each of the three sides of the triangle.

16. A display panel, comprising the pixel structure of claim 15.

17. A pixel structure, comprising a plurality of pixel units, wherein:

each of the pixel units comprises four sub-pixels, and the four sub-pixels are one first sub-pixel, two second sub-pixels, and one third sub-pixel, respectively;

the two second sub-pixels share a common side to form a second sub-pixel unit;

the first sub-pixel and the third sub-pixel are disposed at two opposite sides of the second sub-pixel unit, respectively;

each of the pixel units has a shape of a triangle;

same sub-pixels are arranged along circles in the plurality of pixel units, and any adjacent two same sub-pixels in a circle shares a common side, forming a plurality of first sub-pixel groups each comprising the first sub-pixels arranged along a circle, a plurality of second sub-pixel groups each comprising the second sub-pixels arranged along a circle, and a plurality of third sub-pixel groups each comprising the third sub-pixels arranged along a circle;

the plurality of first sub-pixel groups, the plurality of second sub-pixel groups, and the plurality of third sub-pixel groups constitute the pixel structure;

the first sub-pixel groups and the second sub-pixel groups are arranged alternately in a first direction to form a first pixel group;

the second sub-pixel groups and the third sub-pixel groups are arranged alternately in the first direction to form a second pixel group;

the first pixel group and the second pixel group are alternately arranged in a second direction;

second sub-pixel groups in any adjacent the first pixel group the second pixel group are arranged in a staggered manner;

the first direction intersects with the second direction;

each of the first sub-pixel groups and each of the third sub-pixel groups have quadrilateral shapes with a same shape and a same area;

each of the first sub-pixel groups is formed by joining eight red sub-pixels arranged radially;

each of the third sub-pixel groups is formed by joining eight blue sub-pixels arranged radially; and each of the second sub-pixel groups has a shape of an octagon and is formed by joining eight green sub-pixels arranged radially.

18. A display panel, comprising the pixel structure of claim 17.

* * * * *